United States Patent
Periyannan et al.

(10) Patent No.: US 11,222,865 B2
(45) Date of Patent: Jan. 11, 2022

(54) SEMICONDUCTOR DEVICE INCLUDING VERTICAL BOND PADS

(71) Applicant: WESTERN DIGITAL TECHNOLOGIES, INC., San Jose, CA (US)

(72) Inventors: Kirubakaran Periyannan, Santa Clara, CA (US); Daniel Linnen, Naperville, IL (US); Jayavel Pachamuthu, San Jose, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 16/872,613

(22) Filed: May 12, 2020

(65) Prior Publication Data

US 2021/0358886 A1  Nov. 18, 2021

(51) Int. Cl.
*H01L 23/00* (2006.01)
*H01L 25/065* (2006.01)

(52) U.S. Cl.
CPC .............. *H01L 24/94* (2013.01); *H01L 24/05* (2013.01); *H01L 24/13* (2013.01); *H01L 24/45* (2013.01); *H01L 25/0657* (2013.01)

(58) Field of Classification Search
CPC combination set(s) only.
See application file for complete search history.

(56) References Cited

U.S. PATENT DOCUMENTS

| | | | |
|---|---|---|---|
| 9,202,797 B1* | 12/2015 | Chen | H01L 24/43 |
| 2008/0017971 A1* | 1/2008 | Hollis | H01L 24/03 |
| | | | 257/698 |
| 2012/0032684 A1* | 2/2012 | Siddiquie | G01R 31/70 |
| | | | 324/538 |
| 2012/0056327 A1* | 3/2012 | Harada | G02B 6/43 |
| | | | 257/773 |
| 2013/0148401 A1* | 6/2013 | Fai | H01L 23/5226 |
| | | | 365/63 |
| 2015/0200187 A1* | 7/2015 | Park | H01L 25/0657 |
| | | | 257/777 |
| 2018/0047706 A1* | 2/2018 | Upadhyayula | H01L 23/49816 |
| 2018/0175006 A1* | 6/2018 | Yan | H01L 24/85 |
| 2018/0190621 A1* | 7/2018 | Yan | H01L 23/585 |
| 2019/0019777 A1* | 1/2019 | She | H01L 24/96 |
| 2019/0341375 A1* | 11/2019 | Hirano | H01L 23/481 |
| 2020/0227387 A1* | 7/2020 | Xu | H01L 24/48 |
| 2020/0411481 A1* | 12/2020 | Yang | H01L 25/50 |

* cited by examiner

*Primary Examiner* — Mamadou L Diallo
(74) *Attorney, Agent, or Firm* — Vierra Magen Marcus LLP

(57) ABSTRACT

The present technology relates to a semiconductor device including semiconductor dies formed with vertical die bond pads on an edge of the dies. During wafer fabrication, vertical bond pad blocks are formed in scribe lines of the wafer and electrically coupled to the die bond pads of the semiconductor dies. The vertical bond pad blocks are cut through during wafer dicing, thereby leaving large, vertically oriented pads exposed on a vertical edge of each semiconductor die.

19 Claims, 16 Drawing Sheets

SEMICONDUCTOR DEVICE INCLUDING VERTICAL BOND PADS

BACKGROUND

The strong growth in demand for portable consumer electronics is driving the need for high-capacity storage devices. Non-volatile semiconductor memory devices, such as flash memory storage cards, are widely used to meet the ever-growing demands on digital information storage and exchange. Their portability, versatility and rugged design, along with their high reliability and large capacity, have made such memory devices ideal for use in a wide variety of electronic devices, including for example digital cameras, digital music players, video game consoles, PDAs, cellular telephones and solid state drives.

While many varied packaging configurations are known, flash memory semiconductor devices may in general be fabricated as system-in-a-package (SIP) or multichip modules (MCM), where a plurality of semiconductor dies are mounted and interconnected to an upper surface of a small footprint substrate. The substrate may in general include a rigid, dielectric base having a conductive layer etched on one or both sides. Conventional semiconductor dies include die bond pads near an edge of upper surfaces of the dies. The dies are stacked on the substrate in a stepped, offset configuration in order to allow access to the die bond pads on the upper surfaces of each of the dies in the stack.

With the ever-present drive to increase storage capacity in a given size semiconductor package, more and more dies are being stacked together on the substrate. Given the stepped, offset of the stacked dies, the overall length of the die stack is becoming a limiting factor in the number and/or length of the semiconductor dies that may be included in the semiconductor package.

DETAILED DESCRIPTION

The present technology will now be described with reference to the figures, which in embodiments, relate to a semiconductor device including semiconductor dies formed with vertical bond pads on an edge of the dies. During wafer fabrication, vertical bond pad (VBP) blocks are formed in the scribe lines between adjacent semiconductor dies. The die bond pads formed on an upper surface of the semiconductor dies may thereafter be electrically coupled to the VBP blocks. Upon completion, the wafer may be diced so as to cut through the VBP blocks, thereby leaving large, vertically oriented pads exposed on a vertical edge of each semiconductor die.

In order to form a semiconductor device, the semiconductor dies including the vertical bond pads may be stacked directly on top of each other, with no offset, and then vertically wire bonded to each other and a substrate. As the semiconductor dies are not offset, the length of the semiconductor device is no longer a limiting factor in the number or length of the semiconductor dies that can be used in the device.

It is understood that the present invention may be embodied in many different forms and should not be construed as being limited to the embodiments set forth herein. Rather, these embodiments are provided so that this disclosure will be thorough and complete and will fully convey the invention to those skilled in the art. Indeed, the invention is intended to cover alternatives, modifications and equivalents of these embodiments, which are included within the scope and spirit of the invention as defined by the appended claims. Furthermore, in the following detailed description of the present invention, numerous specific details are set forth in order to provide a thorough understanding of the present invention. However, it will be clear to those of ordinary skill in the art that the present invention may be practiced without such specific details.

The terms "top" and "bottom," "upper" and "lower" and "vertical" and "horizontal," and forms thereof, as may be used herein are by way of example and illustrative purposes only, and are not meant to limit the description of the technology inasmuch as the referenced item can be exchanged in position and orientation. Also, as used herein, the terms "substantially" and/or "about" mean that the specified dimension or parameter may be varied within an acceptable manufacturing tolerance for a given application. In one embodiment, the acceptable manufacturing tolerance is ±2.5%.

Figure 1:
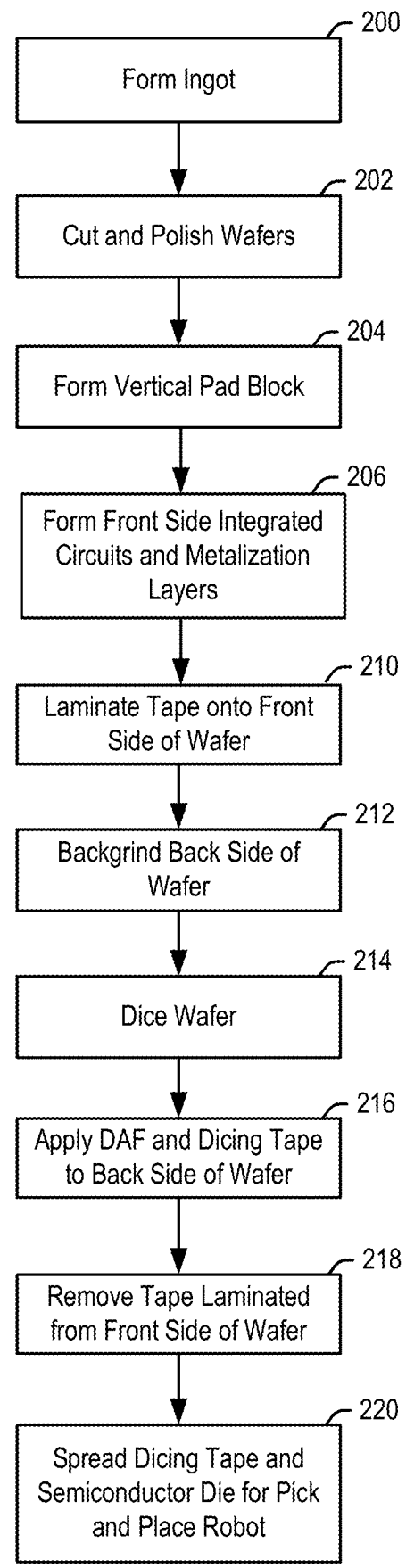
FIG. 1 is a flowchart for forming a semiconductor die according to embodiments of the present technology.
Figure 13:
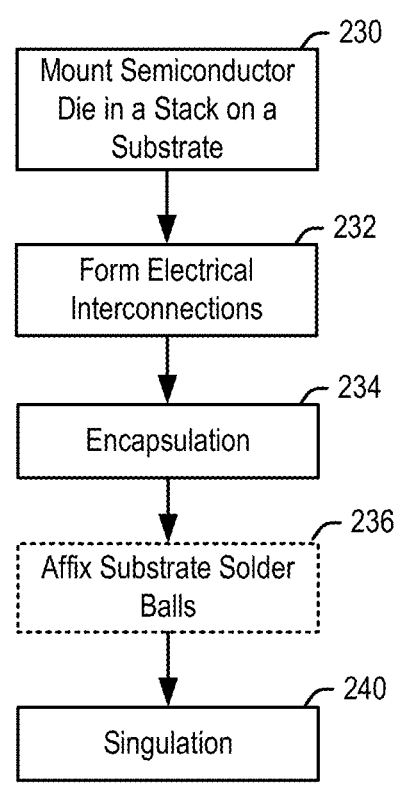
FIG. 13 is a flowchart for forming a semiconductor device using the semiconductor dies according to embodiments of the present technology.
Figure 14:
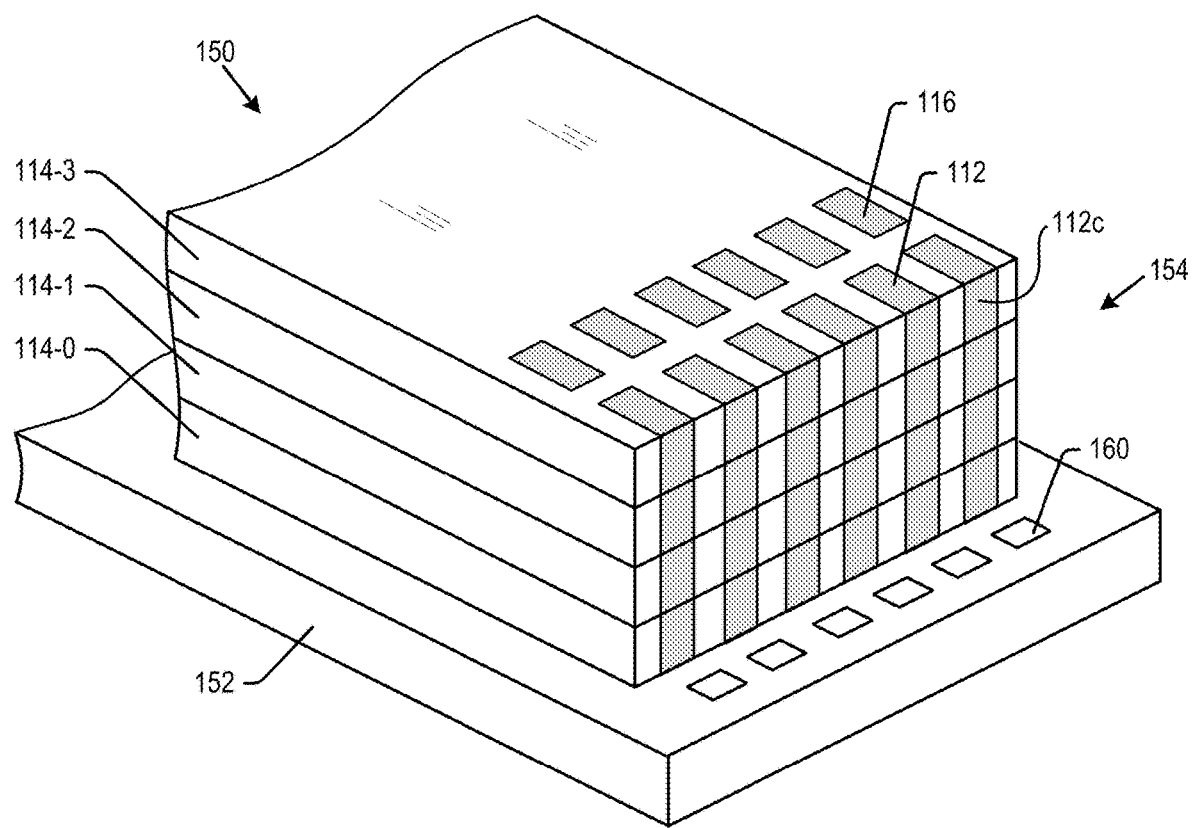
FIG. 14 is a perspective view of a semiconductor device at a first stage of fabrication with semiconductor dies stacked on a substrate according to an embodiment of the present technology.
Figure 15:
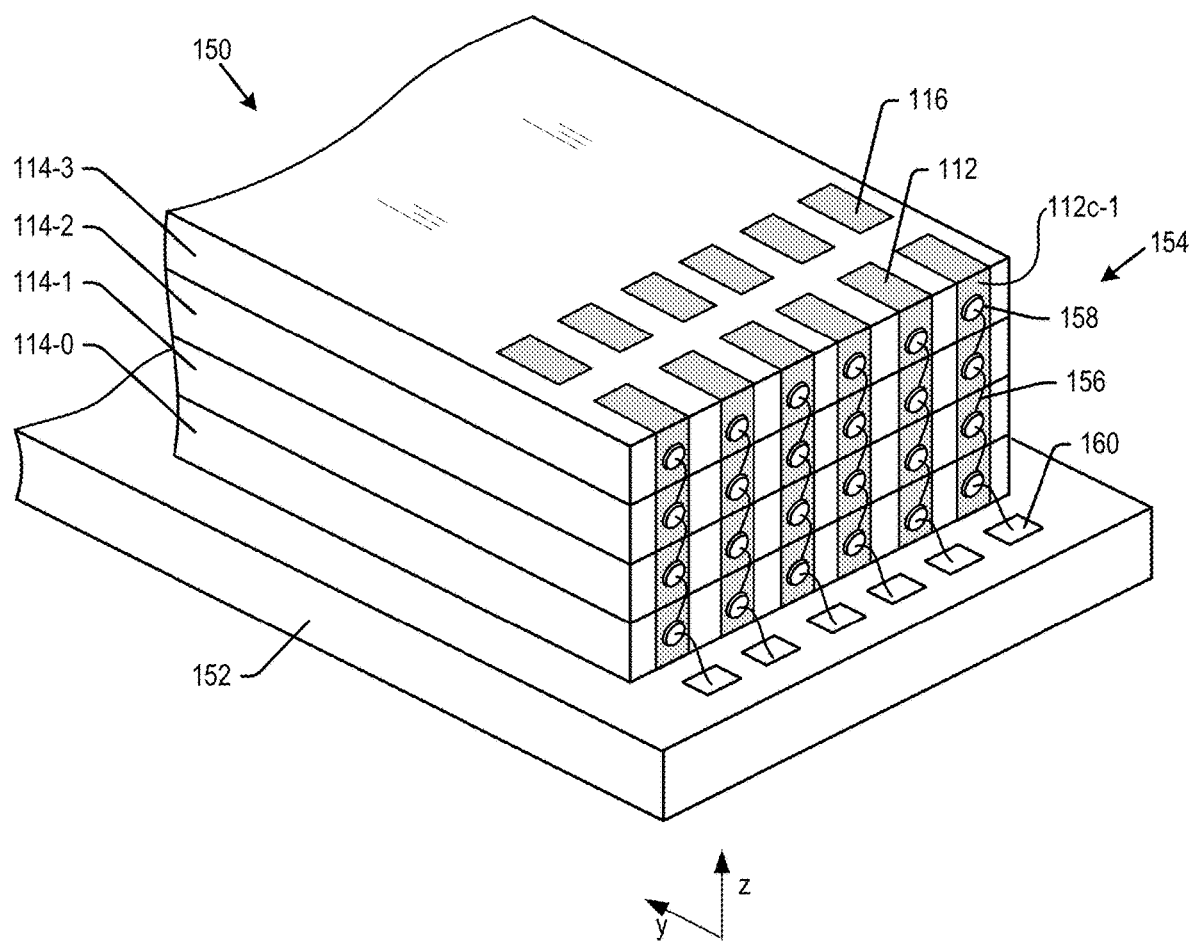
FIG. 15 is a perspective view of the semiconductor device of FIG. 14 at a further stage of fabrication with the semiconductor dies wire bonded to each other according to an embodiment of the present technology.

An embodiment of the present technology will now be explained with reference to the flowcharts of FIGS. 1 and 13, and the views of FIGS. 2-12 and 14-21. Referring initially to the flowchart of FIG. 1, a semiconductor wafer 100 may start as an ingot of wafer material which may be formed in step 200. In one example, the ingot from which the wafers 100 are formed may be monocrystalline silicon grown according to either a Czochralski (CZ) or floating zone (FZ) process. However, wafer 100 may be formed of other materials and by other processes in further embodiments. In step 202, the semiconductor wafer 100 may be cut from an ingot and polished on both the first major surface 102 (FIG. 2), and second major surface 104 (FIG. 6) opposite surface 102, to provide smooth surfaces.

Figure 3:
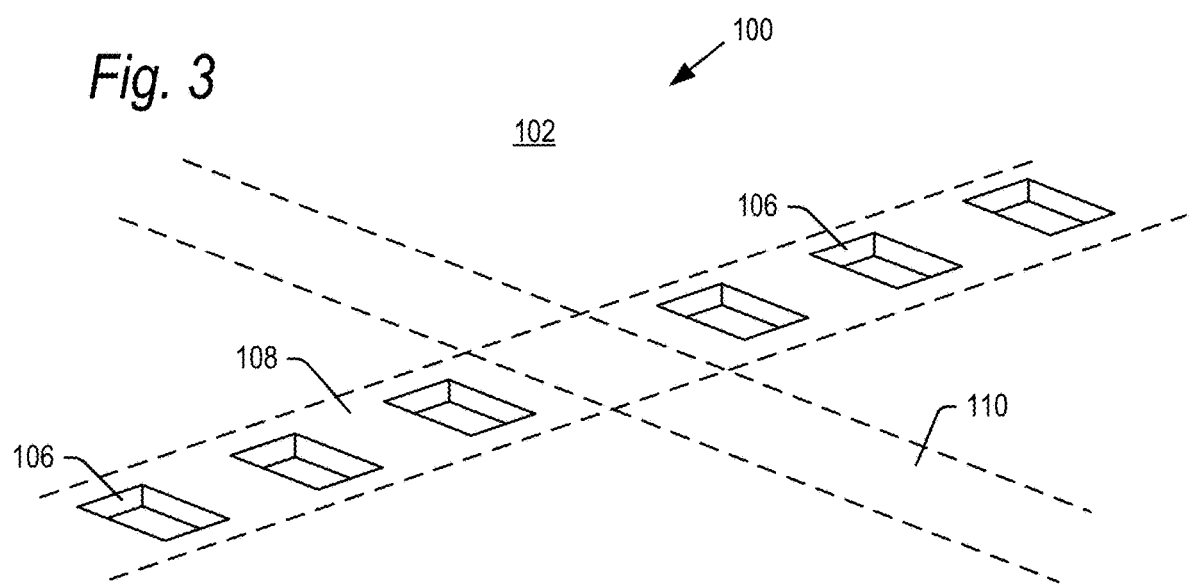
FIG. 3 is an enlarged view of a portion of the wafer showing die bond pads on portions of semiconductor dies and cavities formed in scribe lines between the dies.

In step 204, cavities 106 may be formed in rows and/or columns in the wafer 100, such as for example shown in the enlarged perspective view of wafer 100 in FIG. 3. As explained below, wafer 100 may be processed to form semiconductor dies separated by scribe lines 108 and 110. However, in embodiments, cavities 106 may be formed on wafer 100 before the semiconductor dies or scribe lines are defined in wafer 100. The cavities 106 are formed in what is to be become the scribe lines 108 and/or scribe lines 110. The cavities may be formed after the semiconductor dies and scribe lines are defined in the wafer 100 in further embodiments.

In embodiments, the cavities 106 may be square or rectangular in shape, and may extend to a depth greater than the eventual final thickness of the wafer. For example, as explained below, the wafer may be thinned to 25 microns (μm) and the cavities may be formed to 30 μm. However, it is understood that the cavities may be formed to greater or lesser depths in further embodiments, including to depths that are less than the final thickness of the wafer 100.

Figure 4:
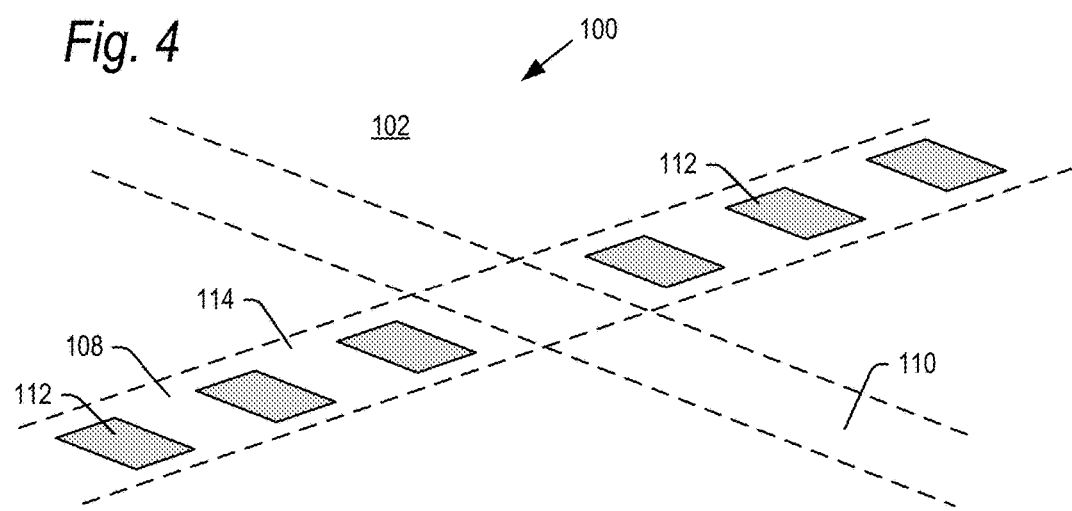
FIG. 4 is an enlarged view of a portion of the wafer showing die bond pads on portions of semiconductor dies and vertical bond pad blocks filing the cavities in scribe lines between the dies.

In step 204, the cavities may be filled with electrical conductor such as for example aluminum to form the vertical bond pad (VBP) blocks 112, as shown in the enlarged perspective view of FIG. 4. The VBP blocks 112 may be formed of other conductive materials in further embodiments including for example copper and alloys of aluminum and copper.

Figure 2:
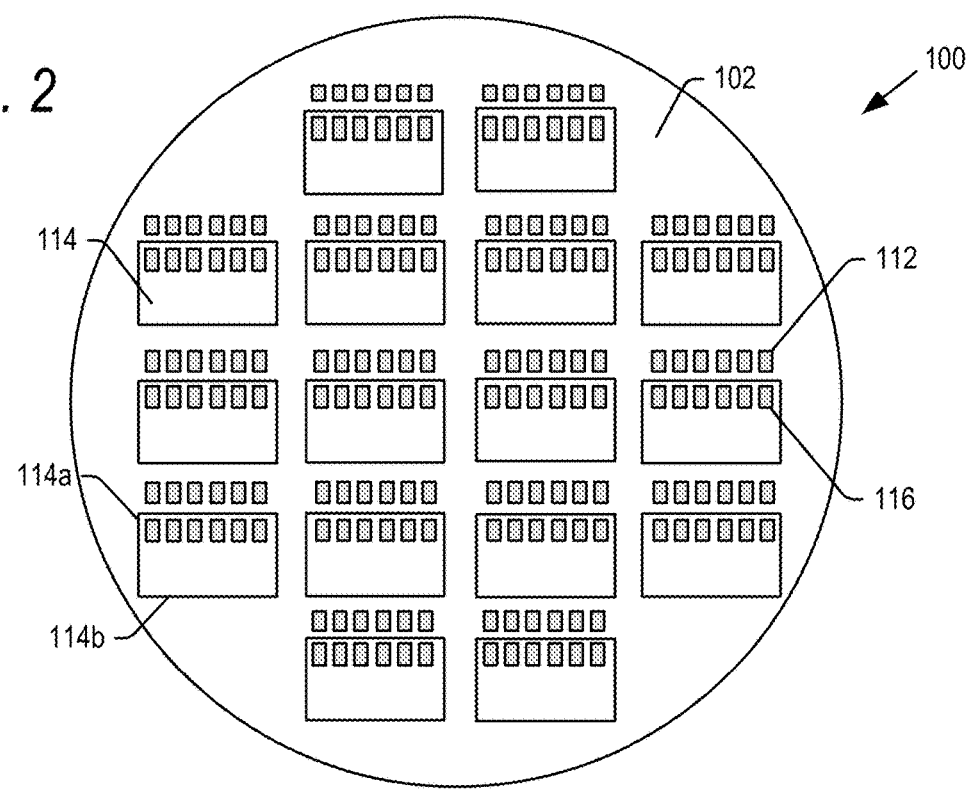
FIG. 2 is a front view of a semiconductor wafer showing a first major surface of the wafer.

In step 206, the first major surface 102 may undergo various processing steps to divide the wafer 100 into respective semiconductor dies 114 (FIGS. 2 and 5), and to form integrated circuits of the respective semiconductor dies 114 on and/or in the first major surface 102. In embodiments, the semiconductor dies 114 may for example be memory dies such as 2D NAND flash memory or 3D BiCS (Bit Cost Scaling), V-NAND or other 3D flash memory, but other types of dies 114 may be used. These other types of semiconductor die include but are not limited to a controller die such as an ASIC, or RAM such as an SDRAM, DDR SDRAM, LPDDR and GDDR. The number of semiconductor die 114 shown on wafer 100 in FIG. 2 is for illustrative purposes, and wafer 100 may include more semiconductor die 114 than are shown in further embodiments.

The semiconductor die 114 may be formed on wafer 100 in rows and columns which are spaced apart from each other on four sides by horizontal scribe lines 108 and vertical scribe lines 110 between semiconductor dies 114 on wafer 100. The scribe lines 108, 110 are reserved as a border around active areas of the semiconductor dies where a cut may be made to dice the semiconductor dies from each other and the wafer 100. In traditional dicing techniques such as sawing, material is removed from the wafer during the cut given the diameter of the saw, and the cut is also not precisely controllable. Thus, the width of a scribe line 108, 110 may for example range between 70 μm and 150 μm, though they may be wider or narrower than that in further embodiments. Dicing methods such as stealth dicing before grinding provide for tighter tolerances and can be controlled to within a few microns, thereby allowing for narrower scribe lines 108, 110.

The processing step 206 may include metallization steps depositing metal contacts including die bond pads 116 exposed on the first major surface 102. Each semiconductor die 114 may include a proximal end 114a to which the bond pads 116 are adjacent, and a distal end 114b opposite the proximal end 114a.

The die bond pads 116 may for example be formed of aluminum, but the pads 116 may be formed of other materials in further embodiments including copper and alloys of aluminum and copper. In embodiments, each die bond pad 116 may have a length and width of approximately 50 μm to 70 μm, though the length and width of pads 116 may vary in further embodiments. The bond pads 116 (contact layer plus liner) may have a thickness of 720 nm, though this thickness may be larger or smaller in further embodiments. Each VBP block 112 may have a width of approximately 50 μm to 70 μm, and may have a length (across the width of a scribe line) of approximately 70 μm to 150 μm, though the length and width of blocks 112 may vary in further embodiments.

The number of VBP blocks 112 and bond pads 116 on each semiconductor die 114 are shown for illustrative purposes, and each die 114 may include more VBP blocks 112 and die bond pads 116 than are shown in further embodiments. In embodiments, there is a VBP block 112 for each die bond pad 116. However, in further embodiments, there may be more die bond pads 116 than there are VBP blocks, with some die bond pads 116 having no connection to a VBP block 112. Similarly, in further embodiments, there may be more VBP blocks 112 than there are due bond pads 116, with some VBP blocks 112 having no connection to a die bond pads 116.

Figure 5:
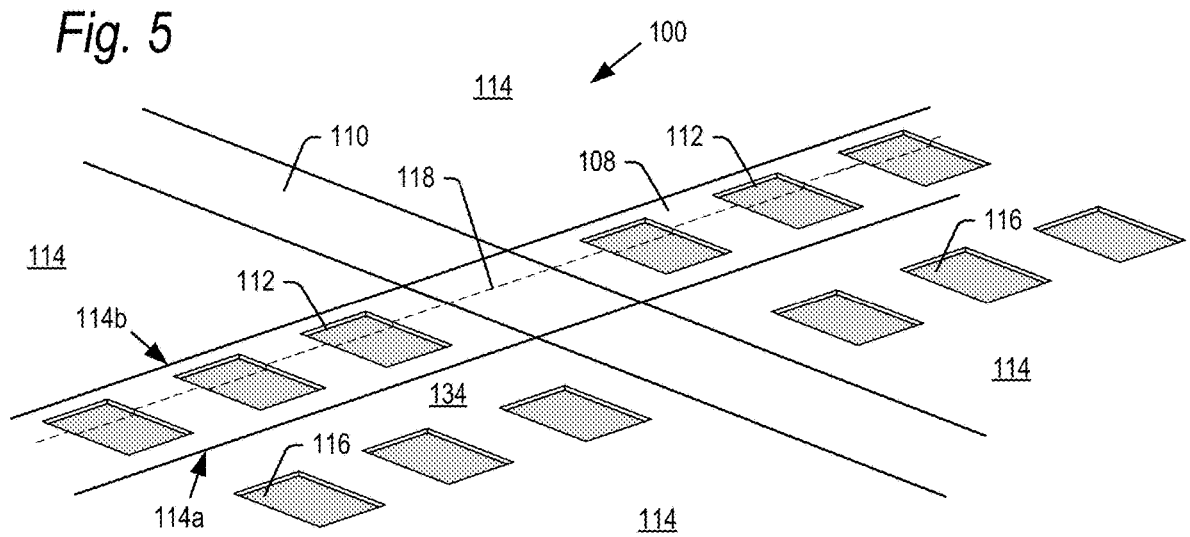
FIG. 5 is an enlarged view of a portion of the wafer showing die bond pads on portions of semiconductor dies coupled to the vertical bond pad blocks in scribe lines between the dies.

As noted, the die bond pads 116 may be routed by internal electrical interconnects to the integrated circuits defined within the semiconductor die 114, and are used to transfer signals to and from the integrated circuits. A row of VBP blocks 112 may be formed on each semiconductor die adjacent the row of die bond pads 116, at least partially within the scribe lines 108 as shown in FIG. 5. As shown, a row of VBP blocks 112 may be formed within the scribe line 108 between the proximal and distal ends 114a, 114b of adjacent rows of semiconductor dies 114. In further embodiments, VBP blocks 112 may additionally or alternatively be formed in scribe lines 110.

In accordance with aspects of the present technology, the VBP blocks 112 are severed along dicing line 118 (FIG. 5) when the semiconductor dies 114 are diced from the wafer 100. As shown, the die 114 may be cut so that portions of the scribe lines 108, 110 remain as a border around each semiconductor die. The amount of the VBP block 112 that may remain in proximal end 114a as part of die 114 after cutting along dicing line 118 may vary, but in embodiments, may for example be 5 to 100 μm. The portions of VBP blocks 112 remaining after dicing may be greater or lesser than that amount in further embodiments. After dicing, a residual portion of each VBP block 112 may remain unused in the distal end 114b of the semiconductor dies 114.

Figure 6:
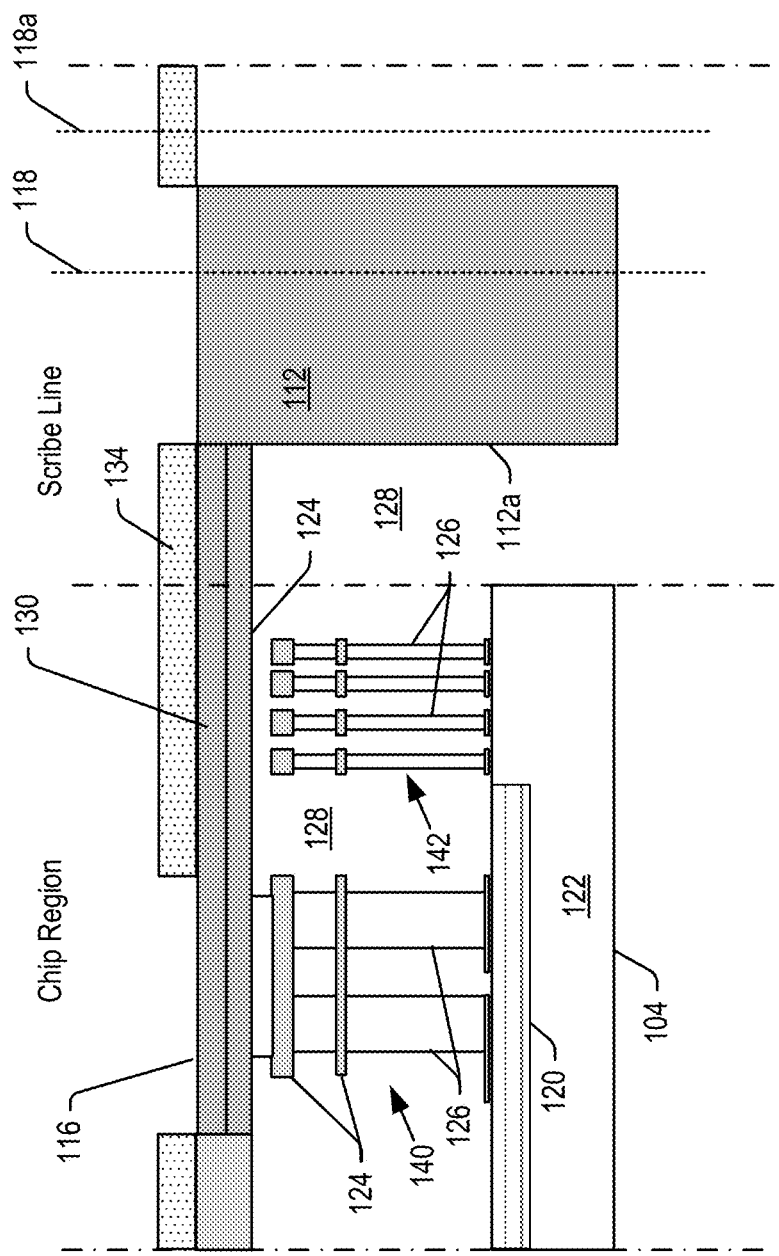
FIG. 6 is a cross-sectional edge view showing a vertical bond pad block, die bond pad, and internal components within the wafer according to aspects of the present technology.
Figure 7:
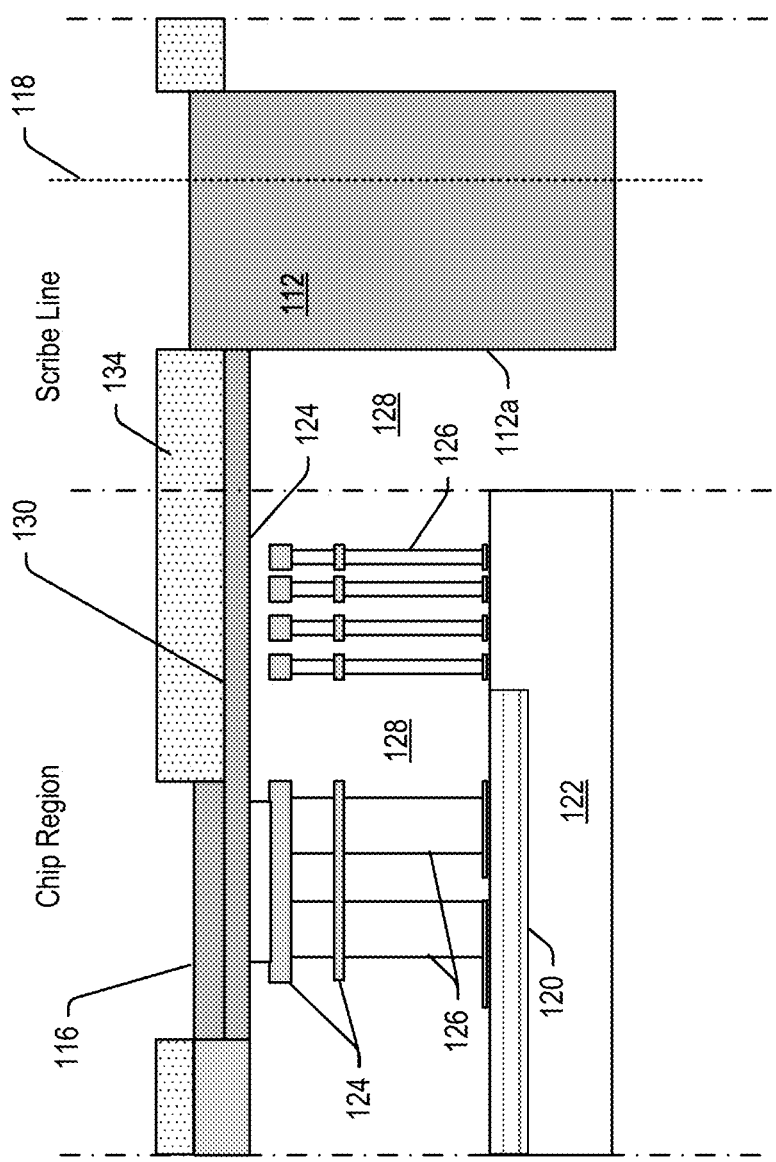
FIGS. 7-10 are cross-section edge views showing a vertical bond pad block, die bond pad, and internal components within the wafer according to alternative embodiments of the present technology.

FIG. 6 is a cross-sectional side view of a proximal end 114a including a chip region and scribe line of a semiconductor die 114 shown for example in FIG. 2. Each semiconductor die 114 may include integrated circuits 120 formed in and/or on a substrate layer 122 within a chip region of the semiconductor wafer. After formation of the integrated circuit 120, multiple layers of metal interconnects 124 and vias 126 may be formed sequentially in layers of a dielectric film 128. As is known in the art, the metal interconnects 124, vias 126 and dielectric film layers 128 may be formed a layer at a time using photolithographic and thin-film deposition processes. The photolithographic processes may include for example pattern definition, plasma, chemical or dry etching and polishing. The thin-film deposition processes may include for example sputtering and/or chemical vapor deposition. The metal interconnects 124 may be formed of a variety of electrically conductive metals including for example copper, aluminum and alloys thereof as is known in the art. The vias may be lined and/or filled with a variety of electrically conductive metals including for example tungsten, copper and copper alloys as is known in the art.

The top metallization layer 124 (also referred to as the M2 layer) may be used as a base upon which the die bond pads 116 are formed. In accordance with aspects of the present technology, the top M2 layer 124, and possibly the bond pads 116 themselves, may be continued to form pad extensions 130 which extend between the bond pads 116 and their associated VBP blocks 112 to electrically couple the bond pads to the blocks. In the embodiment shown in FIG. 6, both the M2 layer 124 and bond pads 116 are extended into the pad extension 130 between the bond pads and blocks. In a further embodiment shown in FIG. 7, the bond pads 116 end, and just the M2 layer 124 continues to form the pad extensions 130 to electrically couple the bond pads 116 to the VBP blocks 112.

Figure 8:
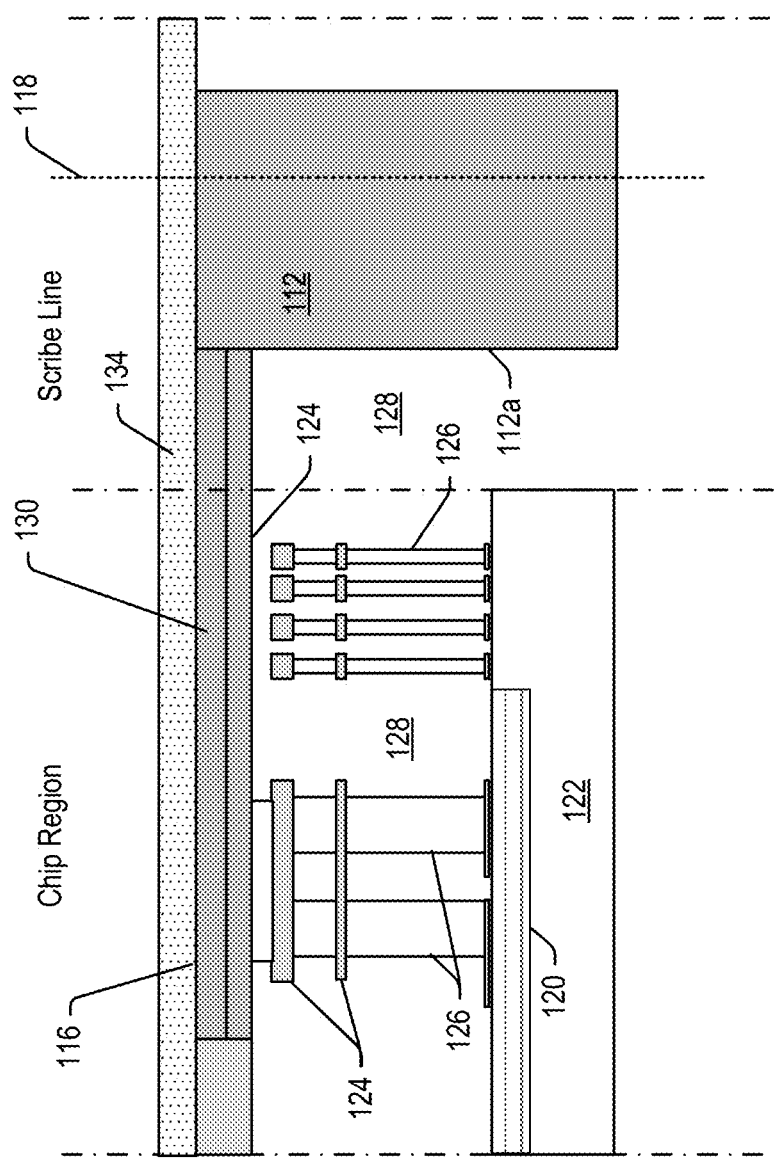

As seen for example in FIGS. 5 and 6, a passivation layer 134 may be formed on top of the upper dielectric film layer 128. The passivation layer 134 may be etched to expose the die bond pads 116 and VBP blocks 112. As explained below, there may be advantages to having an upper surface of the VBP blocks 112 exposed through the passivation layer 134 as shown in FIGS. 5 and 6. However, in a further embodiment shown in FIG. 8, the passivation layer 134 may not be etched over the VBP blocks 112 and/or the die bond pads 116, so that the VBP blocks 112 and/or the die bond pads 116 may remain buried beneath the passivation layer 134. Where the blocks 112 and pads 116 remain covered, the passivation layer 138 may be formed over the entire surface of wafer 100 to provide a smooth, planar surface on the wafer 100 and the respective semiconductor die 114, as indicated in FIG. 8.

Figure 9:
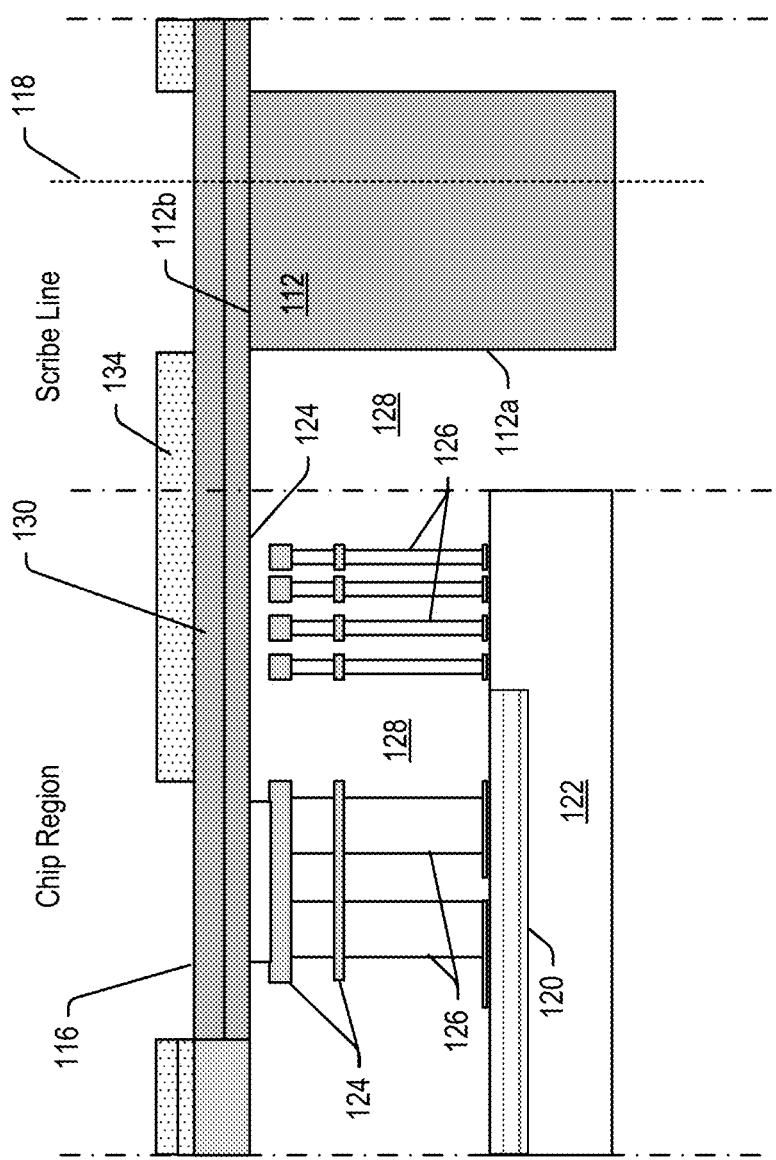

In embodiments, pad extension 130 comprised of the M2 layer 134, and possibly the bond pad 116, may extend into contact with a side surface 112a of the VBP blocks 112 as shown in FIG. 6. However, in a further embodiment, the VBP blocks 112 may be slightly recessed, and the pad extensions 130 may extend partially or completely over an upper surface 112b of the VBP blocks 112. Such an embodiment in shown in FIG. 9. FIG. 9 shows both the M2 layer 124 and bond pad 116 extending over the VBP blocks 112, but just one of those layers may extend over the blocks 112 in further embodiments. In each of the various embodiments shown and described, the pad extensions 130 serve to electrically couple bond pads 116 to their associated VBP block 112.

Figure 10:
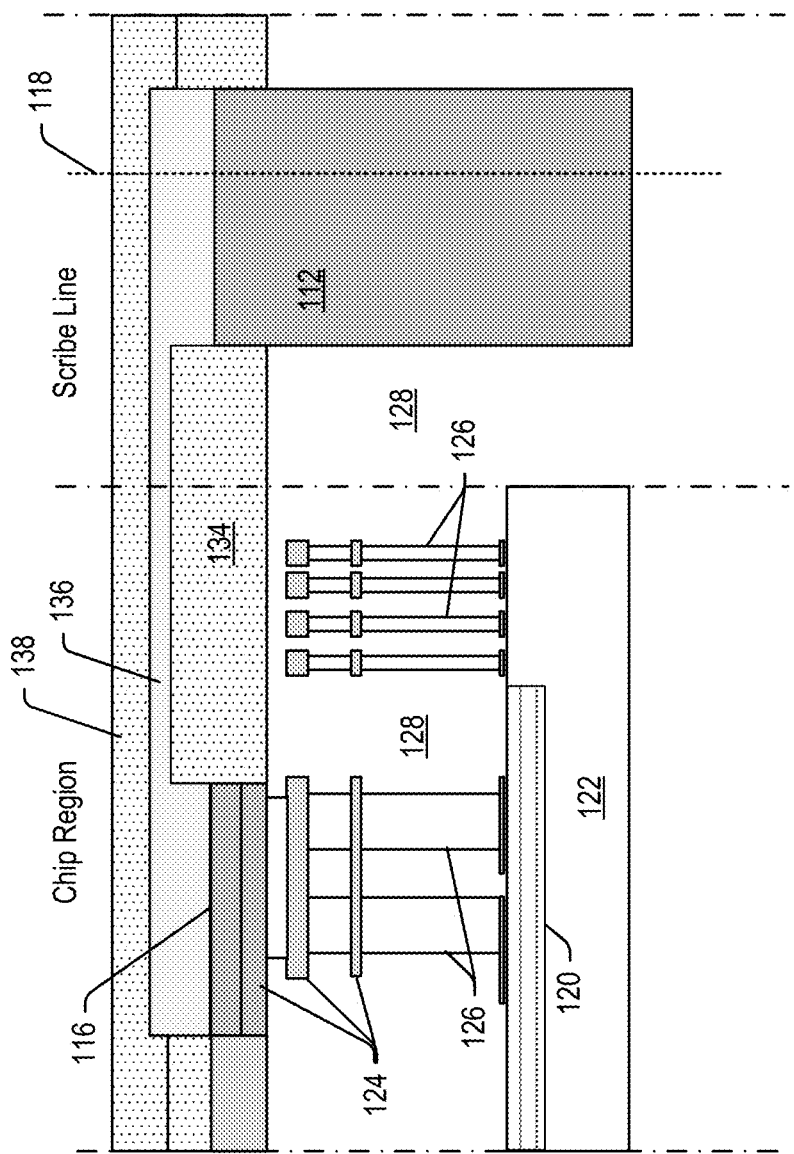

In a further embodiment shown in FIG. 10, the die bond pads 116 may be electrically coupled to their respective VBP blocks 112 not by the M2 layer 124, but instead by a redistribution layer (RDL) 136 formed over the passivation layer 134. Once the passivation layer 134 has been etched to expose bond pads 116 and VBP blocks 112, RDL traces 136 may be formed over the passivation layer 134, between bond pads 116 and VBP blocks 112, to electrically connect the bond pads 116 and VBP blocks 112. In embodiments, the RDL traces 136 may be formed of copper, aluminum or alloys thereof. In embodiments, a further passivation layer 138 may be formed over the RDL traces 136. The passivation layer 138 may be formed over the entire surface of wafer 100 to provide a smooth, planar surface on the wafer 100 and the respective semiconductor die 114, as indicated in FIG. 10. In further embodiments, the passivation layer 138 may be etched over the VBP blocks 112, and/or over the die bond pads 116.

Referring again to FIG. 6, the metal interconnects 124 and vias 126 may be used to form conductive nodes 140 within the chip region for transferring signals and voltages between the die bond pads 116 and integrated circuits 120. The metal interconnects 124 and vias 126 may also be used to form a seal ring 142 within a seal ring area. The seal ring 142 may surround the integrated circuits 120 and conductive nodes 140, and provide mechanical support to prevent damage to the integrated circuits 120 and conductive nodes 140, for example during dicing of the wafer 100.

In the embodiments of FIGS. 3-10, the die bond pads 116 may be formed in the chip regions, inside of the seal ring areas and scribe lines 108 on wafer 100. The VBP blocks 112 may be formed in scribe lines 108, and possibly scribe lines 110, outside of the seal ring areas, on wafer 100. The chip regions and seal ring areas may together be referred to herein as the active area of a semiconductor die 114. FIGS. 5-10 also show dicing line 118 representing a line along which the semiconductor dies 114 are cut from wafer 100. As shown, the dicing line 118 cuts through the VBP blocks 112 to leave an exposed portion of the VBP blocks 112 at the edge of each semiconductor die 114 upon dicing from wafer 100, as described below.

After formation of the integrated circuits 120 and metal conducting layers in steps 204 and 206, a layer of tape may be laminated onto the major surface 102 of wafer 100 in step 210. With the taped surface 102 supported against a chuck, the wafer may then be thinned in step 212 using a grinding wheel (not shown) applied to the second major surface 104. The grinding wheel may thin the wafer 100 from, for example, 780 μm to its final thickness of for example about 25 μm to 36 μm. It is understood that the wafer 100 may be thinner or thicker than this range after the backgrind step in further embodiments.

The wafer may then be diced in step 214. Various techniques may be used to dice wafer 100, including for example using a traditional saw blade. As seen in cross-sectional view of FIG. 6, the saw blade may cut along line 118, directly through the VBP blocks 112 associated with each die. In further embodiments, the saw blade may cut along line 118a of FIG. 6, sawing to the side of, not through, the VBP blocks 112. Thereafter, the die edge may be etched to expose the VBP blocks 112 in the side edge of the dies. This may serve to prolong the life of the saw blades used for dicing.

The wafer 100 may be diced using other techniques in further embodiments, including for example stealth dicing before grinding and waterjet techniques. In stealth dicing before grinding, a laser may emit a pulsed beam focused to a point beneath the wafer's surface 104 using an optical system, for example including one or more collimating lenses. The laser may create a number of pinpoint holes in the scribe lines 108, 110 in the shape of the dies 114. Thereafter, vibration or other stress causes cracks to propagate from the holes along vertical crystalline planes which extend to the first and second major planar surfaces 102, 104 to dice the semiconductor dies 114. These cracks may pass through VBR blocks 112 to cut through the blocks 112, leaving a surface of the VBP blocks 112 exposed in the side edge of the dies 114. In embodiments using stealth dicing before grinding, the backgrind step may take place after the lasing step, with the backgrind step causing propagation of the cracks to complete dicing of the wafer 100.

After completion of the backgrind and dicing steps 212 and 214, a layer of die attach film (DAF) adhered to a flexible dicing tape may be applied onto the second major surface 104 of the wafer 100 in step 216. The wafer 100 may then be turned over and supported on a chuck or other support surface, and the lamination tape on the first major surface 102 of the wafer 100 may be removed in step 218. Once on the chuck, the flexible dicing tape may be stretched along orthogonal axes to separate the individual semiconductor dies 114 in step 220 to allow the individual semiconductor dies 114 to be removed by a pick and place robot for inclusion in a semiconductor device as explained below.

Figure 11:
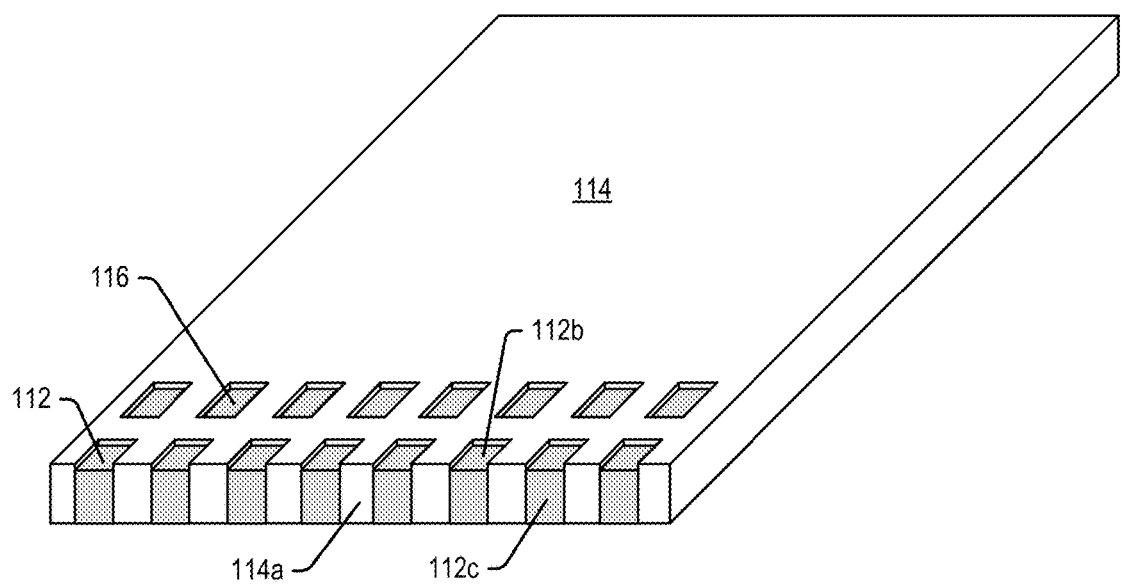
FIG. 11 illustrates a perspective view of a finished semiconductor die according to an embodiment of the present technology.
Figure 12:
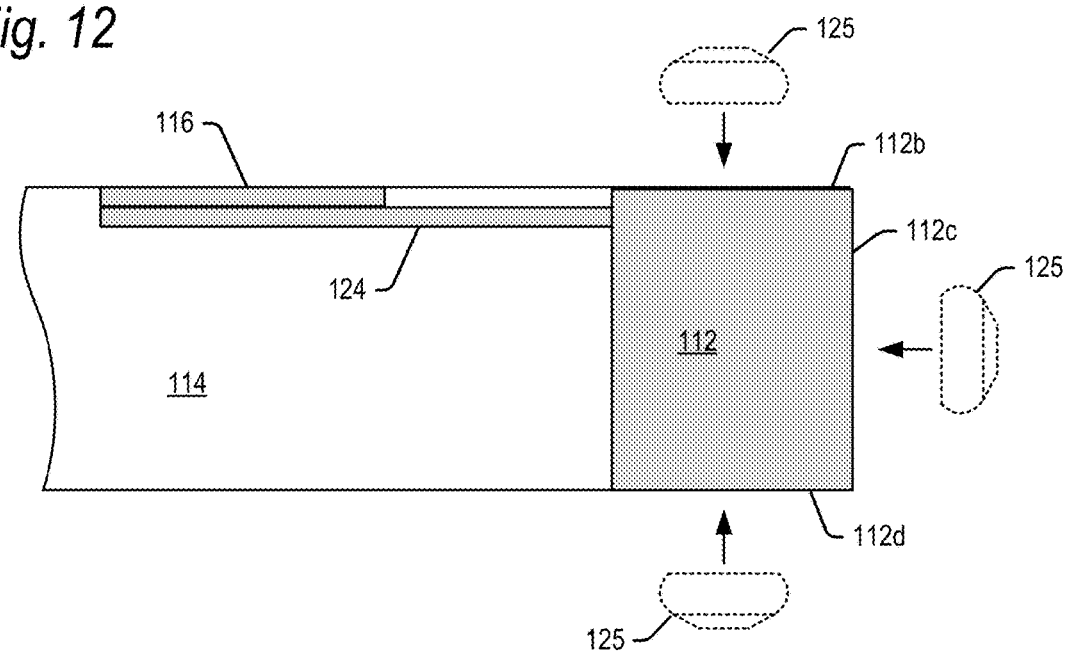
FIG. 12 illustrates a cross-sectional side view of a finished semiconductor die according to an embodiment of the present technology.

FIG. 11 shows a perspective view of a semiconductor die 114 after dicing from wafer 100. The die 114 includes VBP blocks 112 at the proximal end 114a, and die bond pads 116 spaced inward from the proximal end 114a. As shown in FIG. 11 and the cross-sectional edge view of FIG. 12, the VBP blocks 112 may have three surfaces exposed at the proximal end 114a of a die 114: upper surface 112b (as noted above), edge surface 112c and bottom surface 112d. Any or all of these surfaces may receive a metal conductor 125 (shown in phantom in FIG. 12) for electrically coupling the VBP block 112 to another component. This metal conductor 125 may for example be a ball bump, wire bond or other electrical connector.

The edge surface 112c, also referred to herein as edge pad 112c, may extend along the entire vertical edge between the first and second major surfaces of the die 114, as where the VBP blocks are thinned in the backgrind step. As noted, this edge may have a length (die thickness) of for example about 25 μm to 36 μm. Where the VBP blocks are formed to a depth that is less than the final thickness of the wafer 100, the VBP blocks may extend along a portion of the vertical edge between the first and second major surfaces of the die 114. In either case, it is a feature of the present technology that the edge pads 112c of the VBP blocks 112 are large enough to receive a conventional ball bump and/or wire bond as explained below.

Individual semiconductor die 114 may be packaged together to form a semiconductor device 150 as will now be explained with reference to the flowchart of FIG. 13 and the illustrations of FIGS. 14-19. In a step 230, a number of semiconductor die 114 may be stacked on a substrate 152 as shown in the perspective view of FIG. 14. The die may be affixed to each other and the substrate 152 by the DAF layer on the bottom surface of each die, cured to a B-stage to preliminarily affix the dies 114 in the stack 154, and subsequently cured to a final C-stage to permanently affix the die 114 in the stack 154.

While the illustrated embodiment includes 4 semiconductor dies 114-0 to 114-3, embodiments may include different numbers of semiconductor die in die stack 154, including for example 1, 2, 4, 8, 16, 32 or 64 die. There may be other numbers of die in stack 154 further embodiments. In accordance with aspects of the present technology, where multiple semiconductor dies 114 are included, the semiconductor dies 114 may be stacked directly atop each other with no offset to form a die stack 154. Thus, the footprint of the die stack 154 on the substrate 152 is the same size as the footprint of the individual dies 114. As such, the length of the semiconductor device 150 is no longer a limiting factor in the cumulative number of dies that can be used in stack 154. However, as explained below, the die 114 may stacked in a stepped, offset configuration in further embodiments.

Although not shown, one or more passive components may additionally be affixed to the substrate 152. The one or more passive components may include for example one or more capacitors, resistors and/or inductors, though other components are contemplated.

The electrical interconnections between the semiconductor dies 114 and substrate 152 may be formed in step 232. In one embodiment shown in FIG. 15, the semiconductor dies 114 may be electrically coupled to each other and the substrate 152 via electrical connectors such as bond wires 156 affixed to vertical edge pads 112c of the VBP blocks 112. Wires 156 may be bonded to the edge pads 112c according to a number of schemes. However, in one embodiment, a wire bond capillary (not shown) forms a ball bump 158 on a first edge pad 112c (e.g., edge pad 112c-1 of die 114-3). From there, the wire bond capillary pays out wire and forms a stitch bond on corresponding edge pad 112c of the next adjacent semiconductor die (die 114-2 in this example). This process continues across the die stack until the bond wires 156 couple the edge pads 112c of die 114-3 to the edge pads 112c of the die 114-2. This process is then repeated down the stack to bond each of the dies 114 to each other.

Generally, a wire bond capillary has a central axis orthogonal to a surface it is bonding to so that the capillary can press down on the surface to form the wire bond. Thus, in forming the wire bonds between the edge pads 112c, the wire bond capillary may be mounted along a horizontal axis. Alternatively, the wire bond capillary may have a vertical central axis, and the die stack 154 may be supported vertically (with edge pads 112c in a horizontal plane) to form the bonds.

The final set of bond wires 156 may be formed between the edge pads 112c of the bottommost die 114-0 and the contact pads 160 of substrate 152. In embodiments, the edge pads 112c are oriented 90° from the substrate contact pads 160. Given this orthogonal orientation, the final set of bond wires may be formed a number of ways. In one example, the wire bond capillary is capable of forming a bond on surfaces that are orthogonal to each other, e.g., on edge pads 112c oriented perpendicular to the y-axis (FIG. 15), and on contact pads 160 oriented perpendicular to the z-axis. It is also possible that all of the dies 114 in die stack 154 may be wire bonded to each other before they are mounted on substrate 152, so that only the final bond between the bottommost die the stack 154 and the contact pads 160 of substrate 152 need be formed.

The die stack 154 may be mounted directly on the substrate 152 as shown. In further embodiments, the die stack may be spaced from the substrate by spacers (such as spacers 166, FIG. 17). This may provide clearance for the wire bond capillary to form the bonds between the bottommost die 114-0 and the substrate 152 (the spacers may also provide room for a controller die mounted directly on the substrate beneath the die stack as explained below). In further embodiments, the bond between the die stack 154 and the substrate need not be made from the bottommost die 114-0. It may come from another die in stack 154.

Figure 16:
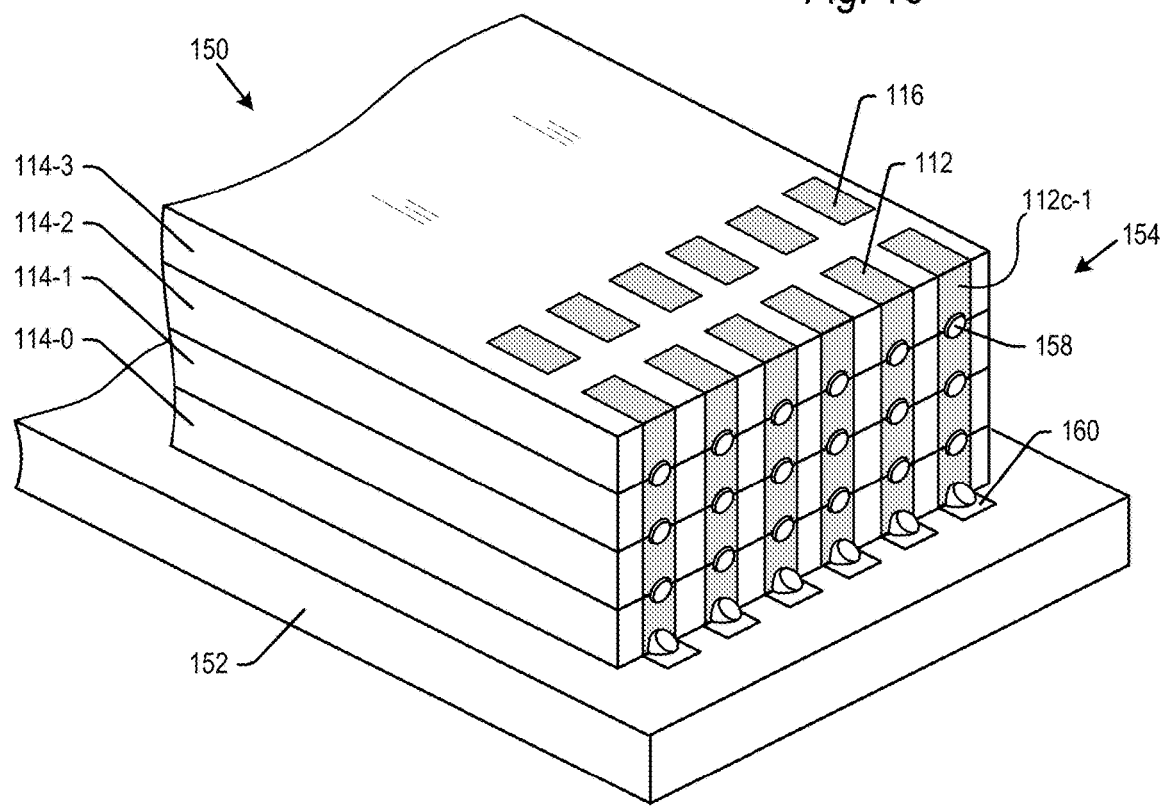
FIG. 16 is a perspective view of the semiconductor device of FIG. 14 with the semiconductor dies electrically coupled according to an alternative embodiment of the present technology.

The VBP blocks 112 with the conductive edge pads 112c offer the possibility of other electrical connector schemes. One such scheme is shown in the perspective view of FIG. 16. In FIG. 16, the edge pads 112c of corresponding VBP blocks 112 in respective dies 114 are electrically coupled to each other by ball bumps 158 applied so as to overlap edge pads 112c in adjacent dies 114. Such ball bumps may also be formed at the orthogonal interface between the edge pads 112c of the bottommost die 114-0 and the contact pads 160 of the substrate 152 as shown.

Instead of straddling a pair of edge pads 112c, an electrical conductive bump (such as a bump 125, FIG. 12) may be provided on the top surfaces 112b and/or the bottom surfaces 112d of the VBP blocks 112. For example, a conductive bump may be provided on the bottom surfaces 112d of the VBP blocks 112. The die may be stacked atop each other as explained above, and thereafter, the conductive bumps on surfaces 112d may be reflowed to electrically couple each of the corresponding VBP blocks to each other and the substrate. In such embodiments, the bumps 125 may for example be solder bumps, solder columns or stud bumps, applied at the wafer level or after dicing of the dies 114 from the wafer 100.

In a further alternative embodiment (not shown), the conductive bumps 125, wire bonds 156 and ball bonds 158 may be omitted, and the VBP blocks 112 in respective dies 114 may be affixed to each other simply by being mounted on top of each other. That is, when dies are mounted on top of each other in stack 154, the bottom surface 112d (FIG. 12) of each VBP block 112 rests on top of the top surface 112b of the next lower die. This contact may be sufficient to electrically couple the corresponding VBP blocks in respective dies to each other, and also to the contact pads 160 of the substrate.

Figure 17:
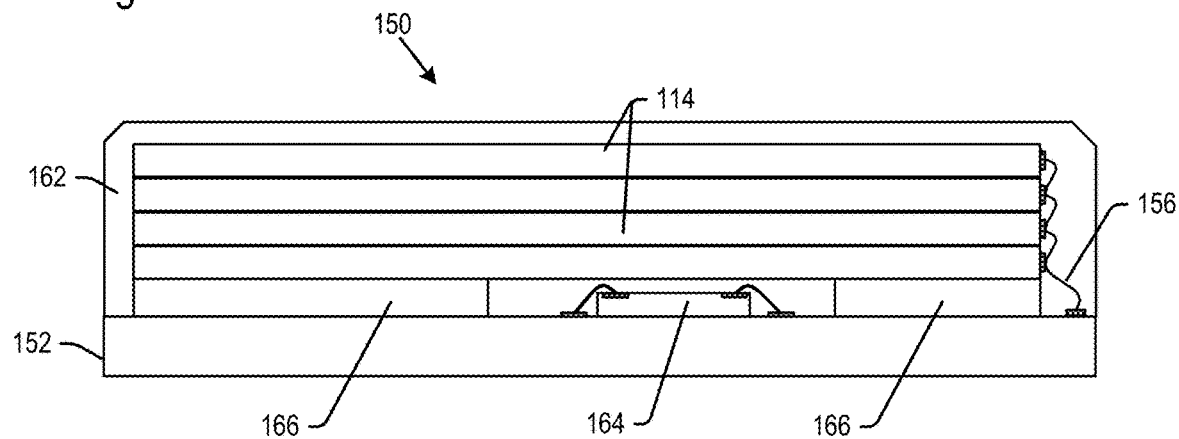
FIG. 17 is an edge view of a completed semiconductor device according to embodiments of the present technology.

Once the dies 114 are electrically coupled to each other and substrate 152, the device 150 may be encapsulated in a mold compound 162 in step 234 as shown in FIG. 17. In step 236, solder balls (not shown) may optionally be affixed to a lower surface of substrate 152 to affix the semiconductor device 150 to a host device such as a printed circuit board. In embodiments, the semiconductor devices 150 may be assembled on a panel of substrates 152 to achieve economies of scale. In step 240, fabrication of the semiconductor device 150 may be completed by singulating respective semiconductor devices from a panel of such devices.

The semiconductor device 150 shown in FIG. 17 may further include a controller die 164, such as an ASIC, wire bonded to the substrate 152 for controlling the semiconductor dies 114. The controller die may be coupled to the substrate 152 by other means, including by flip-chip mounting. The controller die may also be fabricated to include VBP blocks with vertical edge pads as explained above with respect to dies 114. In the example shown, the controller die 164 may be provided in an under-the-die configuration, mounted directly to the substrate 152. In such embodiments, the die stack 154 may be mounted on top of dielectric spacers 166 to make room for the controller die 164 and its wire bonds beneath the die stack. The controller die 164 may alternatively be mounted next to the die stack 154, or on top of the die stack 154.

Forming a bonding surface or pad (112c) on the proximal ends 114a of the dies according to embodiments of the present technology offers several advantages. For example, as noted above, without a stepped offset, the footprint of the die stack 154 on the substrate 152 may be the same size as the footprint of a single die 114 no matter how many dies are used in stack 154. Without the stepped offset, the length of the semiconductor device 150 is no longer a limiting factor in the number of dies that can be used in stack 154. Moreover, as the dies are not stacked in a stepped, offset configuration, each die may have a length that is maximized, for example to be slightly less than the overall length of the semiconductor package 150.

Figure 18:
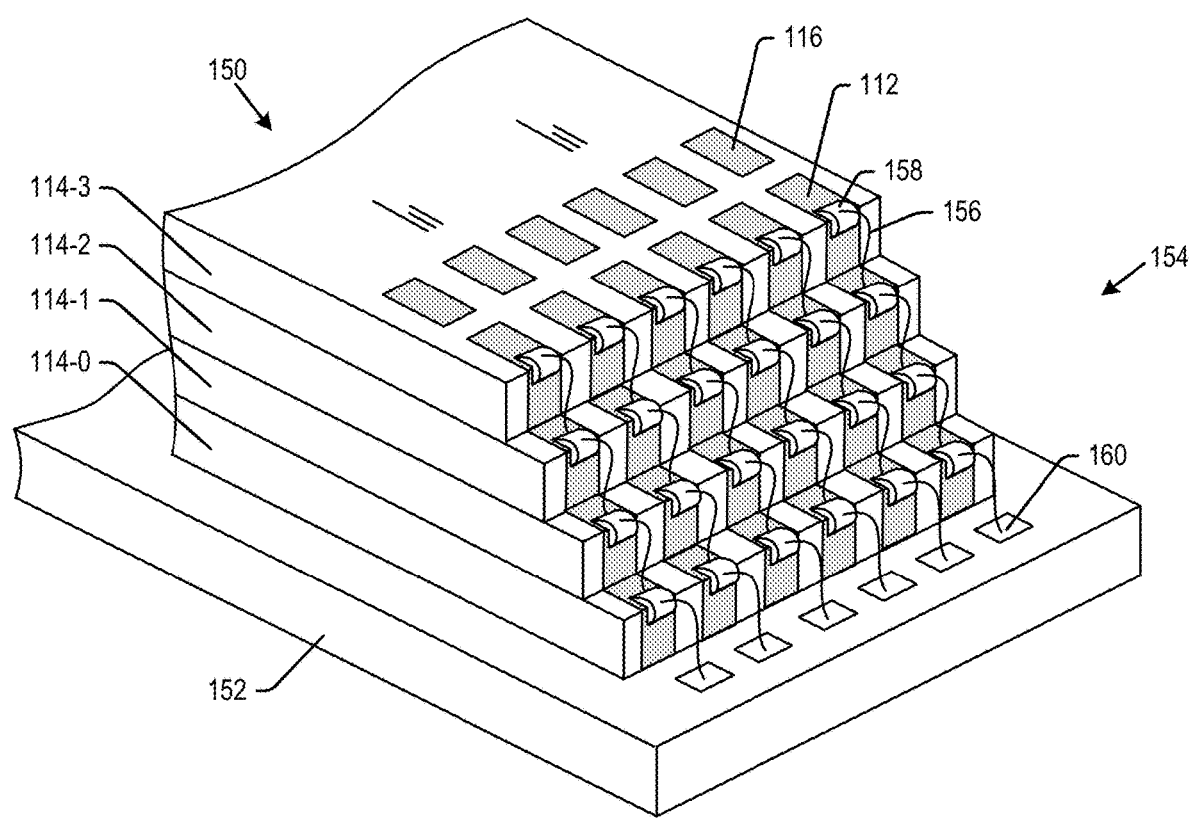
FIGS. 18-19 are perspective views of semiconductor devices according to alternative embodiments of the present technology.
Figure 19:
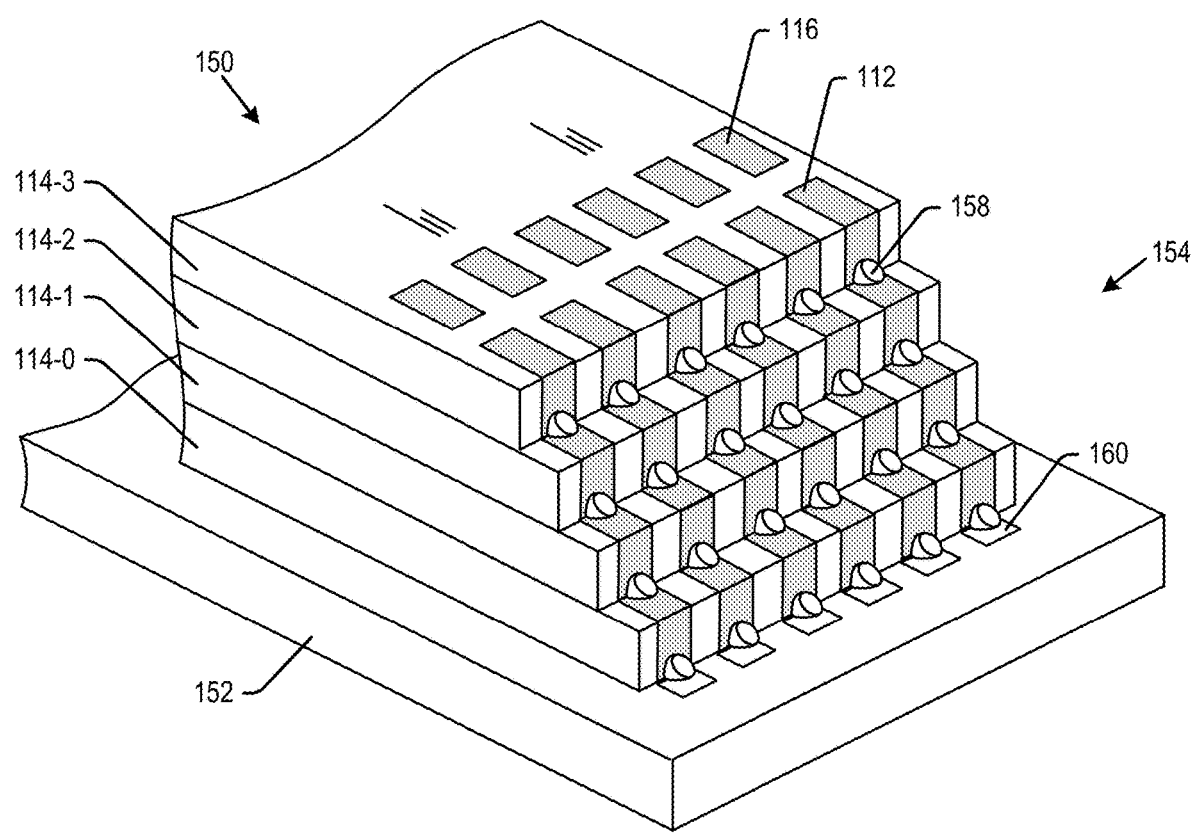

While stacking the semiconductor die directly on top of each other has advantages explained above, the die 114 may stacked in a stepped offset configuration in further embodiments. Such an embodiment is shown in FIGS. 18 and 19. In FIG. 18, the dies 114 are stepped offset from each other, and then wire bonded with bond wires 156 and ball bumps 158 as described above. In this embodiment, the ball bumps 158 and wire bonds may be applied to the top surface 112b, the vertical edge pad 112c, or both the top surface 112b and edge pad 112c as shown in FIG. 18. In a further embodiment, the wires 156 may be bonded from die to die from the bottom surface 112d. In such an embodiment, the die stack and bond wires would in effect be flipped over relative to the view shown in FIG. 18. In a further embodiment of a stepped offset die stack 154, the bond wires may be omitted, and ball bumps 158 provided where the edge pads 112c and top surfaces 112b come together on adjacent dies in the stack. Such an embodiment is shown in FIG. 19.

It is understood that any of the above electrical coupling schemes shown in FIGS. 14-19 may be combined in different ways with each other to electrically couple semiconductor dies 114 to each other and the substrate 152 using the VBP blocks 112.

Figure 20:
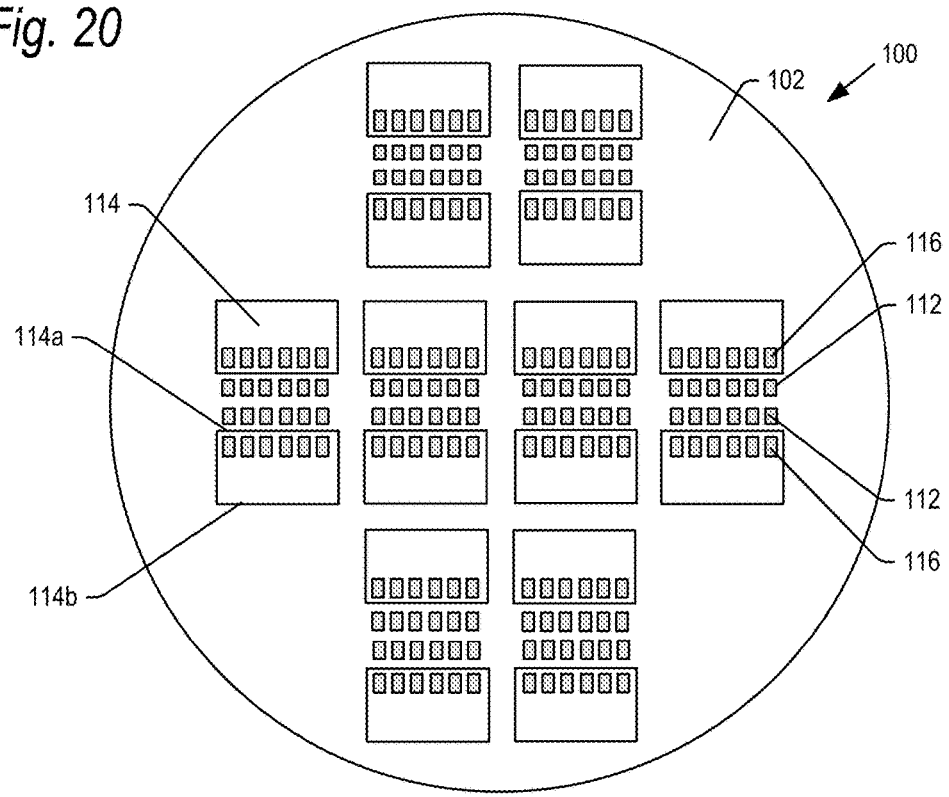
FIG. 20 is a front view of a semiconductor wafer showing a first major surface of the wafer with semiconductor dies arranged according to an alternative embodiment of the present technology.
Figure 21:
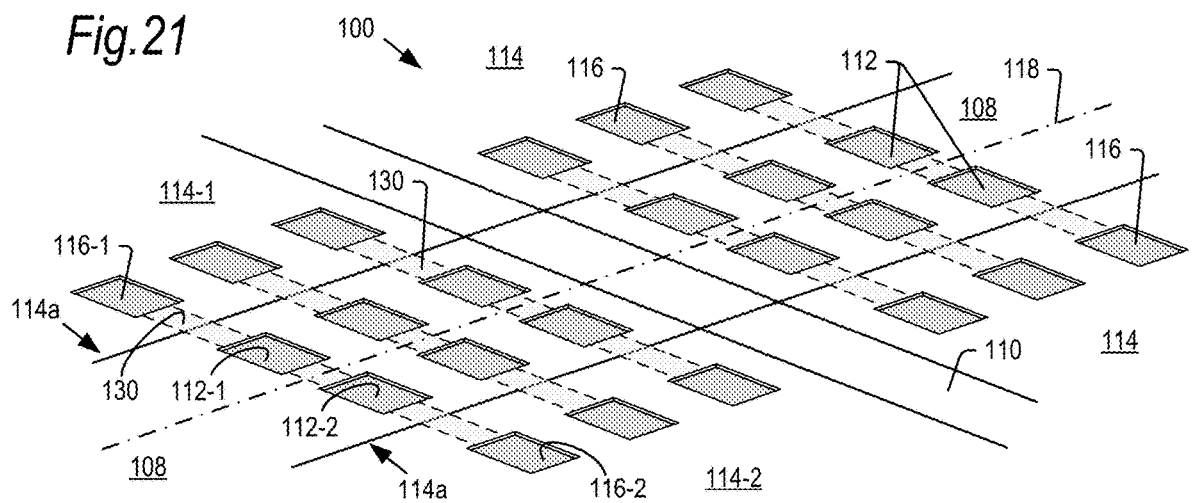
FIG. 21 is an enlarged view of a portion of the wafer of FIG. 20 showing die bond pads on portions of semiconductor dies coupled to the vertical bond pad blocks in scribe lines between the dies.

In embodiments described above, the dies 114 are arranged in rows, each facing the same direction as shown in the front view of the wafer 100 in FIG. 2. It is understood that the dies 114 may be arranged on the wafer 100 in other configurations in further embodiments. For example, FIGS. 20 and 21 show a front view and an enlarged partial perspective view of a wafer 100 having mirrored rows of semiconductor dies 114. In such an embodiment a first row of semiconductor dies 114 has a proximal end 114a including the die bond pads 116 facing the proximal end 114a including die bond pads 116 of a second row of semiconductor dies 114.

The wafer 100 of FIGS. 20 and 21 may include a first row of semiconductor dies, including a semiconductor die 114-1, separated by a scribe line 108 from a second row of semiconductor dies, including semiconductor dies 114-2 (the scribe lines 108 and 110 may not be drawn to scale relative to each other in FIG. 21). The first semiconductor die 114-1 may include a set of die bond pads 116-1 and an associated set of VBP blocks 112-1 in the scribe line 108. The second semiconductor die 114-2 may also include a set of die bond pads 116-2 and an associated row of VBP blocks 112-2 in the scribe line 108. In accordance with this embodiment, pad extensions 130 (shown in dashed lines beneath the passivation layer) may electrically couple each die bond pad 116-1 and VBP block 112-1 from die 114-1 with a die bond pad 116-2 and VBP block 112-2 from die 114-2.

Such a configuration at the wafer level has an advantage that each pair of adjacent dies may be tested simultaneously, cutting testing time generally in half. That is, a test probe may touch-down on a pad and test the two dies electrically coupled to that pad by the pad extension 130. Despite the advantages in testing time, adjacent pairs of VBP blocks shown in FIGS. 20 and 21 need not be electrically coupled to each other in further embodiments.

Once testing is completed, the dies 114 in wafer 100 may be diced along cut line 118, passing between adjacent pairs of VBP blocks in scribe line 108, thus electrically isolating the VBP blocks and their associated dies from each other. This also has the above-stated advantage that a saw blade passes through silicon, and not the VBP blocks, to prolong the life of the saw blade. After the cut is made, the proximal edge may be etched to expose the vertical edge pad 112c of each of the VBP blocks 112 as described above.

In summary, an example of the present technology relates to a semiconductor die, comprising: first and second major surfaces; a plurality of die bond pads formed in the first major surface; an edge extending between the first and second major surfaces; and a plurality of edge pads exposed at the edge, the plurality of edge pads being electrically coupled to the plurality of die bond pads, and the plurality of edge pads configured to receive ball bumps and/or wire bonds.

In another example, the present technology relates to a semiconductor device, comprising: a plurality of semiconductor die mounted together in a die stack, each semiconductor die of the plurality of semiconductor dies comprising: first and second major surfaces, a plurality of die bond pads formed in the first major surface, an edge extending between the first and second major surfaces, and a plurality of vertical bond pad blocks electrically coupled to the plurality of die bond pads, each of the plurality of vertical bond pads blocks comprising an edge pad exposed at the edge of each semiconductor die; and electrical connectors electrically coupling the plurality of semiconductor dies to each other.

In a further example, the present technology relates to a semiconductor device, comprising: a plurality of semiconductor die mounted together in a die stack, each semiconductor die of the plurality of semiconductor dies comprising: first and second major surfaces, a plurality of die bond pads formed in the first major surface, an edge extending between the first and second major surfaces, and edge connector means for electrically coupling the plurality of die bond pads to the edge of each of the semiconductor dies; and electrical connector means for electrically coupling the plurality of semiconductor dies to each other.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. A semiconductor die, comprising:
   first and second major surfaces;
   a plurality of die bond pads formed in the first major surface;
   an edge extending between the first and second major surfaces;
   a plurality of edge pads exposed at the edge, the plurality of edge pads being electrically coupled to the plurality of die bond pads, and the plurality of edge pads configured to receive ball bumps and/or wire bonds; and
   a plurality of vertical bond pad blocks, each vertical bond pad block comprising an edge pad of the plurality of edge pads.

2. The semiconductor die of claim 1, wherein the plurality of edge pads extend a full height of the edge between the first and second major surfaces.

3. The semiconductor die of claim 1, wherein a vertical bond pad block of the plurality of vertical bond pad blocks further comprises a first surface exposed at the first major surface of the semiconductor die, the first surface configured to receive a ball bump and/or wire bond.

4. The semiconductor die of claim 3, wherein the vertical bond pad block further comprises a second surface exposed at the second major surface of the semiconductor die, the second surface configured to receive a ball bump and/or wire bond.

5. The semiconductor die of claim 1, wherein the plurality of edge pads are exposed at the edge upon dicing the semiconductor die from a wafer.

6. The semiconductor die of claim 1, wherein the plurality of die bond pads are formed in a chip region of the semiconductor die, and the plurality of edge pads are formed in a scribe line region of the semiconductor die.

7. The semiconductor die of claim 1, wherein the plurality of die bond pads are electrically coupled to the plurality of edge pads by one or more metallization layers within the semiconductor die.

8. The semiconductor die of claim 1, wherein the plurality of die bond pads are electrically coupled to the plurality of edge pads by a redistribution layer formed over the first major surface.

9. A semiconductor device, comprising:
   a plurality of semiconductor dies mounted together in a die stack, each semiconductor die of the plurality of semiconductor dies comprising:
      first and second major surfaces,
      a plurality of die bond pads formed in the first major surface,
      an edge extending between the first and second major surfaces, and
      a plurality of vertical bond pad blocks electrically coupled to the plurality of die bond pads, each of the plurality of vertical bond pads blocks comprising an edge pad exposed at the edge of each semiconductor die; and
   electrical connectors electrically coupling the plurality of semiconductor dies to each other.

10. The semiconductor device of claim 9, wherein the plurality of semiconductor dies directly overlap each other.

11. The semiconductor device of claim 9, wherein the electrical connectors comprise ball bonds and/or bond wires, and wherein the edge pads of the plurality of vertical bond pad blocks are configured to receive the ball bonds and/or bond wires.

12. The semiconductor device of claim 9, wherein the electrical connectors comprise a bond wire coupled to the edge pad of each of the semiconductor dies in the die stack.

13. The semiconductor device of claim 9, wherein the electrical connectors comprise a ball bond coupled to edge pads of adjacent semiconductor dies in the die stack.

14. The semiconductor device of claim 9, wherein the plurality of vertical bond pad blocks in each of the plurality of semiconductor dies further comprises surfaces exposed on at least one of the first and second major surfaces of each of the semiconductor dies.

15. The semiconductor device of claim 14, wherein the electrical connectors are coupled to the surfaces of the vertical bond pad blocks exposed on at least one of the first and second major surfaces of each of the semiconductor dies.

16. The semiconductor device of claim 15, wherein the electrical connectors comprise conductive bumps on the surfaces of the vertical bond pad blocks exposed on one of the first and second major surfaces of each of the semiconductor dies.

17. The semiconductor wafer of claim 9, further comprising a passivation layer on the first major surface of a semiconductor die of the plurality of semiconductor dies, the die bond pads and vertical bond blocks of the semiconductor die buried beneath the passivation layer.

18. A semiconductor device, comprising:
a plurality of semiconductor dies mounted together in a die stack, each semiconductor die of the plurality of semiconductor dies comprising:
first and second major surfaces,
a plurality of die bond pads formed in the first major surface,
an edge extending between the first and second major surfaces, and
edge connector means for electrically coupling the plurality of die bond pads to the edge of each of the semiconductor dies, the edge connector means extending a full height of the edge between the first and second major surfaces; and
electrical connector means for electrically coupling the plurality of semiconductor dies to each other.

19. The semiconductor device of claim 18, wherein the plurality of semiconductor dies directly overlap each other, the electrical connector means affixed to portions of the edge connector means at the edge of the semiconductor dies.

* * * * *